United States Patent [19]
Nakagawa et al.
[11] 4,236,051
[45] Nov. 25, 1980

[54] ELECTRET MICROPHONE

[75] Inventors: Sadayoshi Nakagawa; Mitsuharu Shinohara, both of Fukuoka; Katsutoshi Hashimoto, Nougata, all of Japan

[73] Assignee: Hoshidenki-Seizo Kabushiki Kaisha, Osaka, Japan

[21] Appl. No.: 12,789

[22] Filed: Feb. 16, 1979

[30] Foreign Application Priority Data

Feb. 20, 1978 [JP] Japan ............................ 53-20575[U]

[51] Int. Cl.³ ...................... H04R 19/00; H01L 29/84
[52] U.S. Cl. .................................. 179/111 E; 357/26
[58] Field of Search ....................... 179/111 E, 111 R; 357/26, 23

[56] References Cited

U.S. PATENT DOCUMENTS

| | | | |
|---|---|---|---|
| 3,588,382 | 6/1971 | Reedyk | 179/111 E |
| 3,812,575 | 5/1974 | Hedman | 179/111 E |
| 3,816,671 | 6/1974 | Fraim et al. | 179/111 E |
| 3,896,274 | 7/1975 | Fraim et al. | 179/111 E |
| 3,946,422 | 3/1976 | Yagi et al. | 179/111 E |
| 4,046,974 | 9/1977 | Baumhauer et al. | 179/111 R |

*Primary Examiner*—Daryl W. Cook
*Attorney, Agent, or Firm*—Pollock, VandeSande and Priddy

[57] ABSTRACT

In an electret microphone in which an impedance conversion element housing chamber for an impedance conversion element is provided on the side opposite from an electret diaphragm with respect to a back electrode in a capsule, an isolating metal plate is disposed in the impedance conversion element housing chamber in spaced relation to the back electrode to define between the isolating metal plate and the back electrode an air compartment which is pneumatically isolated from the impedance conversion element chamber.

11 Claims, 1 Drawing Figure

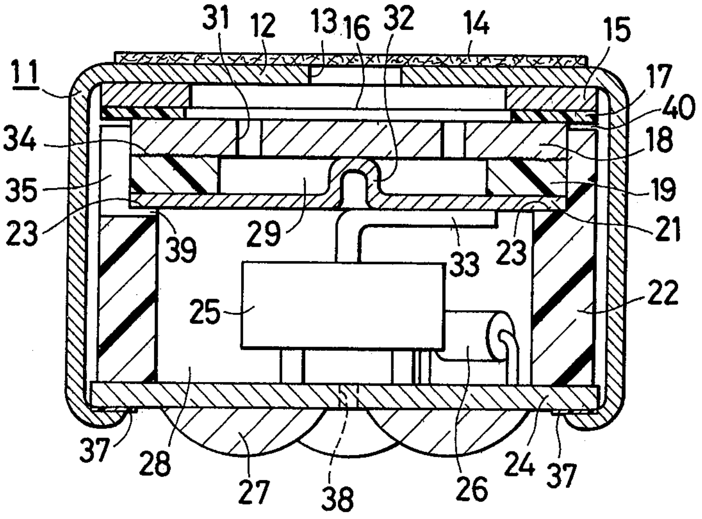
11
31
12
13
16
32
14
15
17
40
18
19
21
22
34
35
23
39
29
33
23
25
37
28
27
38
26
24
37

ELECTRET MICROPHONE

BACKGROUND OF THE INVENTION

This invention relates to an electret microphone which has an impedance conversion element disposed in a capsule.

In conventional electret microphones of this kind, an impedance conversion element such as, for example, a field effect transistor is built in a capsule for the impedance conversion of an electric output signal. With such an arrangement, when soldering a terminal of the impedance conversion element to a printed circuit board, heat generated by the soldering causes a change in the air pressure in a compartment defined on the back of a back electrode which warps the electret diaphragm formed of a synthetic resinous material, providing degraded sensitivity; moreover, a hole is made in the soldered portion to intercommunicate the compartment and the outside, resulting in deteriorated frequency characteristic.

It is an object of this invention to provide an electret microphone whose sensitivity is not affected by soldering of an impedance conversion element.

It is another object of this invention to provide an electret microphone whose frequency characteristic is not degraded by soldering of an impedance conversion element.

It is another object of this invention to provide an electret microphone which exhibits sensitivity from low to high frequency region and hence has a wide frequency band.

It is still another object of this invention to provide an electret microphone which is mechanically stable in its internal structure.

SUMMARY OF THE INVENTION

In accordance with this invention, an isolating metal plate is disposed in spaced relation to a back electrode on the opposite side from a diaphragm to provide an air compartment between the metal plate and the back electrode which is isolated by the metal plate from an impedance conversion element housing chamber. The metal plate is bent to make electrical and mechanical contact with the back electrode to connect it with an impedance conversion element. Thus, the impedance conversion element housing chamber is pneumatically isolated from the air compartment on the side of the back electrode; therefore, even if the air pressure in the impedance conversion element housing chamber changes during soldering of the impedance conversion element, it does not cause a change in the air pressure of the air compartment nor does it warp the diaphragm. Further, a resilient ring-shaped cushion is interposed between the isolating metal plate and the back electrode to permit an air flow between the air compartment and the outside through the cushion itself or through the boundary portion between the cushion and the back electrode or/and the isolating metal plate to such an extent as not to affect the acoustic characteristic of the microphone. Consequently, if a change occurs in the surrounding temperature, the air pressure in the air compartment well follows the outside air pressure and no bad influence is exerted on the diaphragm. Moreover, parts in a microphone capsule are stably retained by virture of the resiliency of the cushion.

BRIEF DESCRIPTION OF THE DRAWING

The accompanying drawing is an enlarged cross-sectional view illustrating an embodiment of this invention.

DESCRIPTION OF THE PREFERRED EMBODIMENT

In the drawing, reference numeral 11 indicates generally a cylindrical capsule formed, for example, of aluminum. On one end face of the capsule 11, that is, on its front, a front plate 12 is formed as a unitary structure with the capsule 11 and has a centrally disposed hole 13 for catching a sound. On the top of the front plate 12 is placed a dust proof and resonance suppressing cloth 14 to cover the hole 13. In the capsule 11, a plate-like ring 15 is disposed on the interior surface of the front plate 12 and an electret diaphragm 16 is adhered on the ring 15 on the opposite side from the front plate 12. The electret diaphragm 16 is a plastic film polarized in its thickwise direction and has a metallic foil deposited on its one surface thereof; and the electret diaphragm 16 is fixed with the metallic foil covered surface held in contact with the ring 15. A back electrode 18 is disposed opposite the electret diaphragm 16 with a ring-shaped spacer 17 interposed therebetween.

Disposed behind the back electrode 18 is a ring-shaped cushion 19, on the back of which is placed a metal plate 21 for purposes of isolation. The back electrode 18 and the metal plate 21 are held by a back electrode holder 22 inserted in the capsule 11. The back electrode holder 22 has a cylindrical configuration substantially coaxial with the capsule 11 and is formed by molding of a synthetic resinous material, for instance. The back electrode holder 22 has an increased inner diameter at one end portion on the side of the diaphragm 16 to form a stepped portion 23 between the increased diameter and the smaller diameter portion. The marginal portion of one side of the metal plate 21 rests on the stepped portion 23; the metal plate 21 is urged by the stepped portion 23 towards the back electrode 18 through the cushion 19, that is, towards the front plate 12 of the capsule 11. A printed circuit board 24 is disposed on the end face of the back electrode holder 22 on its rear side. The rear end portion of the capsule 11 is bent inwardly to be staked, with the result that the metal plate 21, the cushion 19, the back electrode 18, the spacer 17 and the ring 15 are pressed against the front plate 12 through the back electrode holder 22 and mechanically fixed as one body.

On the printed circuit board 24 are mounted an impedance conversion element 25, such as a field effect transistor or a semiconductor integrated circuit, and a resistance element 26 which are disposed inside of the back electrode holder 22. Terminals of these elements are led out through small holes in the printed circuit board 24 and connected by soldering to wirings formed on the underside of the printed circuit board 24, as indicated by 27.

Between the metal plate 21 and the back electrode 18 is defined an air compartment 29 which is pneumatically isolated from an impedance conversion element housing chamber 28 having housed therein the impedance conversion element 25; namely, the metal plate 21 and the stepped portion 23 are held in close contact with each other so as to prevent an easy air flow between them. The back electrode 18 has formed therein air holes 31 leading from the air compartment 29 to the back of the electret diaphragm 16. For example, the central portion of the metal plate 21 is bent towards the back electrode 18 to provide a projection 32 which makes contact with the back electrode 18 to achieve electrical connection therewith. The projection 32 is optionally linked by spot welding with the back electrode 18. To the metal plate 21 is connected, e.g., by spot welding, a control terminal 33 of the impedance conversion element 25.

The cushion 19 is made, for example, of rubber, felt, synthetic resin or the like. Where the cushion 19 is formed of a material having no gas permeability, the contact surface of the cushion 19 with the back electrode 18 is made rough, as indicated by 34. A recess 35 is formed in one portion of the enlarged inner diameter portion of the back electrode holder 22, that is, in one portion of its inner wall abutting with the peripheral portions of the back electrode 18 and so on. Though very small, draft is permitted between the air compartment 29 and the outside through the rough surface 34, or through the cushion itself when it is made of felt. A rough surface may also be formed on the side of the metal plate 21. The roughness of the surface 34 is too small to be visible to the naked eye; for example, in the case of plastic, scratches produced by rolling will do. Also, a rough surface may be formed on the back electrode 18. The recess 35 need not always be provided at one place only but may also be formed at plurality of places.

In conventional electret microphones, the metal plate 21 and the cushion 19 are not employed and the air compartment on the side of the back electrode 18 is formed unitary with the impedance conversion element housing chamber 28. With such an arrangement, during soldering, air in the chamber 28 expands by heat and the increased air pressure is applied via the air holes 31 to the diaphragm 16; since the diaphragm 16 is an electret one, it may in some cases easily expand to change its sensitivity. Further, the expanded air has to escape and hence may escape to the outside through the terminal insertion holes of the printed circuit board 24 to make holes in the solder 27 , with the result that the air compartment 28 communicates with the outside to cause air leakage, thus degrading the frequency characteristic of the microphone.

With the electret microphone of this invention, however, the air compartment 29 is isolated from the impedance conversion element housing chamber 28, so that even if air in the chamber 28 expands due to heat generated during soldering, it has no affect on the air compartment 29; therefore, the diaphragm 16 does not expand nor does the frequency characteristic change. Moreover, even if holes are made in the solder 27, they are not likely to affect the frequency characteristic.

In the inspection of the microphone, a connector is contacted with the terminal to be soldered and, in this case, even if the connector is pressed against the terminal to cause a change in the air pressure of the chamber 28, no influence is exerted on the air pressure in the air compartment 29, so that there is no possibility of the diaphragm 16 being affected to change the frequency characteristic. Since there is no problem even if the impedance conversion element housing chamber 28 communicates with the outside, it is possible to make a positioning hole 38 in the printed circuit board 24 for the connection with a measuring equipment for automatically measuring the characteristic of the microphone. In the case where the positioning hole 38 is not provided, in order to facilitate an air flow between the chamber 28 and the outside, a groove 39, for example, about 0.1 mm is formed in the stepped portion 23 at the position of the recess 35 to permit an air flow between the chamber 28 and the recess 35. As a consequence, a change in the air pressure of the chamber 28 immediately follows up with the outside air pressure through the groove 39. As the air compartment 29 is isolated from the chamber 28 and is small in volume, it is possible to obtain sensitivity even to high frequencies, that is, a wide band characteristic covering the low to high-frequency regions, and to lessen the influence of the cloth 14 on the frequency characteristic. The cloth 14 may be pasted simply on the front plate 12 and may also be a rough nonwoven fabric, which is nice to look at, not likely to fray and can be automatically adhered to the front plate 12.

With the use of the cushion 19, the internal components of the microphone can be fixed sufficiently rigidly by staking of the microphone 11 due to the resiliency of the cushion. This ensures a good electrical connection between a grounding conductor 37 formed on the marginal portion of the underside of the printed circuit board 24 and the crimped portion of the capsule 11. To this end, the face of the back electrode holder 22 on the side of the electret diaphragm 16 is positioned behind the front side of the back electrode 18 on the side of the electret diaphragm 16 to define a small gap 40 between the back electrode holder 22 and the spacer 17. By the selection of the width of the gap 40, i.e. the pressing force applied by the rear end portion of the capsule 11 to the printed circuit board 24, it is possible to control the air flow between the air compartment 29 and the outside. Further, by permitting an air flow between the air compartment 29 and the outside through the very small gaps formed by the rough surface 34 and the recess 35, it is possible that the pressure in the air compartment 29 follows the external atmospheric pressure in such a range that the air leakage does not affect the microphone characteristics.

Although the cushion 19 and the isolating metal plate 21 are employed, the microphone can be easily assembled by sequentially positioning its parts in place as is the case with conventional microphones. Further, the projection 32 formed as a unitary structure with the metal plate 21 automatically makes contact with the back electrode 18 to be electrically connected therewith; no special operation is needed for connecting the metal plate 21 and the back electrode 18. The recess 35 may also be formed around the entire outer periphery of the cushion 19. Thus, even if the internal air pressure changes due to a change in the ambient temperature, it well follows the external atmospheric pressure. For example, in a microphone in which the capsule 11 is about 10 mm in diameter and about 6.5 mm in height, a polyethylene film 0.8 mm thick is used as the cushion 19 and three recesses 35, each 3 mm wide, are formed at equiangular intervals.

It will be apparent that many modifications and variations may be effected without departing from the scope of the novel concepts of this invention.

What is claimed is:

1. An electret microphone comprising:

a cylindrical capsule provided with a front plate having a centrally disposed hole;

an electret diaphragm disposed opposite the inside of the front plate;

a back electrode disposed opposite the back of the electret diaphragm;

an isolating metal plate disposed in spaced relation to the back of the back electrode to define therebetween an air compartment and to make electrical contact with the back electrode;

a back electrode holder placed in the capsule coaxially therewith, the inner diameter of the back electrode holder being increased at one end portion thereof on the side of the electret diaphragm to form a stepped portion, the marginal portion of the back of the isolating metal plate resting on the stepped portion to provide an impedance conversion element housing chamber pneumatically isolated from the air compartment; and an impedance conversion element housed in the impedance conversion element housing chamber and connected with the isolating metal plate.

2. An electret microphone according to claim 1, wherein a printed circuit board having mounted thereon the impedance conversion element is disposed on the back of the back electrode holder, and wherein the rear end portion of the capsule is bent against the back of the printed circuit board to press it towards the front plate.

3. An electret microphone according to claim 1, wherein the central portion of the isolating metal plate is pushed out toward the back electrode to form a projection making mechanical and electrical contact with the back electrode.

4. An electret microphone according to claim 1, wherein a ring-shaped cushion is interposed between the back electrode and the isolating metal plate to form inside thereof the air compartment.

5. An electret microphone according to claim 4, wherein the end face of the back electrode holder on the side of the electret diaphragm is positioned behind the front side of the back electrode on the side of the electret diaphragm, wherein the rear end portion of the capsule is bent inwardly to urge the back electrode holder towards the front plate, and wherein the cushion is resilient to mechanically stabilize parts in the capsule.

6. An electret microphone according to claim 4, wherein the cushion is made of a material which has gas permeability to such an extent as not to affect the acoustic characteristic of the microphone.

7. An electret microphone according to claim 4, wherein at least one of contact surfaces of the cushion and the back electrode is made rough to form in the boundary therebetween an air passage which is so small as not to affect the acoustic characteristic of the microphone.

8. An electret microphone according to claim 6 or 7, wherein at least one portion of the back electrode is positioned in the back electrode holder, and wherein at least one recess is formed opposite the cushion in the end portion of the back electrode holder on the side of the back electrode.

9. An electret microphone according to claim 8, wherein a groove is formed in the stepped portion at the position of the recess to permit an air flow between the impedance conversion element housing chamber and the recess.

10. An electret microphone according to claim 1, wherein a nonwoven fabric is placed on the outside of the front plate to cover its centrally disposed hole.

11. An electret microphone according to claim 2, wherein a positioning hole is made in the printed circuit board.

* * * * *